United States Patent
Li et al.

(10) Patent No.: US 9,511,478 B2
(45) Date of Patent: Dec. 6, 2016

(54) NANO FLUID ELECTROSTATIC ATOMIZATION CONTROLLABLE JET MINIMAL QUANTITY LUBRICATION GRINDING SYSTEM

(71) Applicant: QINGDAO TECHNOLOGICAL UNIVERSITY, Qingdao, Shandong Province (CN)

(72) Inventors: Changhe Li, Qingdao (CN); Dongzhou Jia, Qingdao (CN); Sheng Wang, Qingdao (CN); Qiang Zhang, Qingdao (CN)

(73) Assignee: QINGDAO TECHNOLOGICAL UNIVERSITY, Qingdao (CN)

( * ) Notice: Subject to any disclaimer, the term of this patent is extended or adjusted under 35 U.S.C. 154(b) by 75 days.

(21) Appl. No.: 14/405,962

(22) PCT Filed: Nov. 11, 2013

(86) PCT No.: PCT/CN2013/001361
§ 371 (c)(1),
(2) Date: Dec. 5, 2014

(87) PCT Pub. No.: WO2014/117315
PCT Pub. Date: Aug. 7, 2014

(65) Prior Publication Data
US 2015/0126097 A1   May 7, 2015

(30) Foreign Application Priority Data

Feb. 4, 2013  (CN) .......................... 2013 1 0042095
Feb. 4, 2013  (CN) .......................... 2013 2 0061299

(51) Int. Cl.
| | |
|---|---|
| *B24B 55/03* | (2006.01) |
| *B24B 55/02* | (2006.01) |
| *B05B 5/03* | (2006.01) |
| *B05B 5/08* | (2006.01) |

(Continued)

(52) U.S. Cl.
CPC ................ *B24B 55/03* (2013.01); *B05B 5/03* (2013.01); *B05B 5/087* (2013.01); *B05B 7/0491* (2013.01);

(Continued)

(58) Field of Classification Search
CPC ....... B05B 5/03; B05B 5/087; B05B 7/0491; B05B 7/10; B24B 55/02; B24B 55/03; H01J 37/32073; H01J 37/3244; H01J 37/32568; H01J 37/32697; H01J 2237/327
See application file for complete search history.

(56) References Cited

U.S. PATENT DOCUMENTS

| | | | | |
|---|---|---|---|---|
| 3,747,284 A | * | 7/1973 | Lyczko ................... | B24B 55/02 409/136 |
| 3,995,979 A | * | 12/1976 | Fedrigo ..................... | B05B 5/08 118/622 |
| 8,394,461 B2 | * | 3/2013 | Komatsubara ..... | B22D 17/2007 118/629 |

FOREIGN PATENT DOCUMENTS

| | | |
|---|---|---|
| CN | 102287606 A | 12/2011 |
| CN | 102658526 A | 9/2012 |

(Continued)

OTHER PUBLICATIONS

Jan. 23, 2014 International Search Report issued in International Application No. PCT/CN2013/001361.
Jan. 23, 2014 Written Opinion issued in International Application No. PCT/CN2013/001361.

*Primary Examiner* — Timothy V Eley
(74) *Attorney, Agent, or Firm* — Oliff PLC

(57) ABSTRACT

The present invention relates to a nano fluid electrostatic atomizing controllable jet minimal lubricating for grinding system. A grinding system is provided with a corona charging nozzle, a nozzle body of the corona charging nozzle is connected with a liquid supply system and an air supply system, a high-voltage direct-current electrostatic generator at the lower part of the nozzle body is connected with the cathode of an adjustable high-voltage direct-current power supply, the anode of the adjustable high-voltage direct-current power supply is connected with a workpiece charging device, and the workpiece charging device is attached to the non-machined surface of the workpiece. Nano fluid which used as grinding liquid is fed into the corona charging nozzle through the liquid supply system, meanwhile, the air supply system feeds compressed air into the corona charging nozzle.

10 Claims, 5 Drawing Sheets

Figure 1:
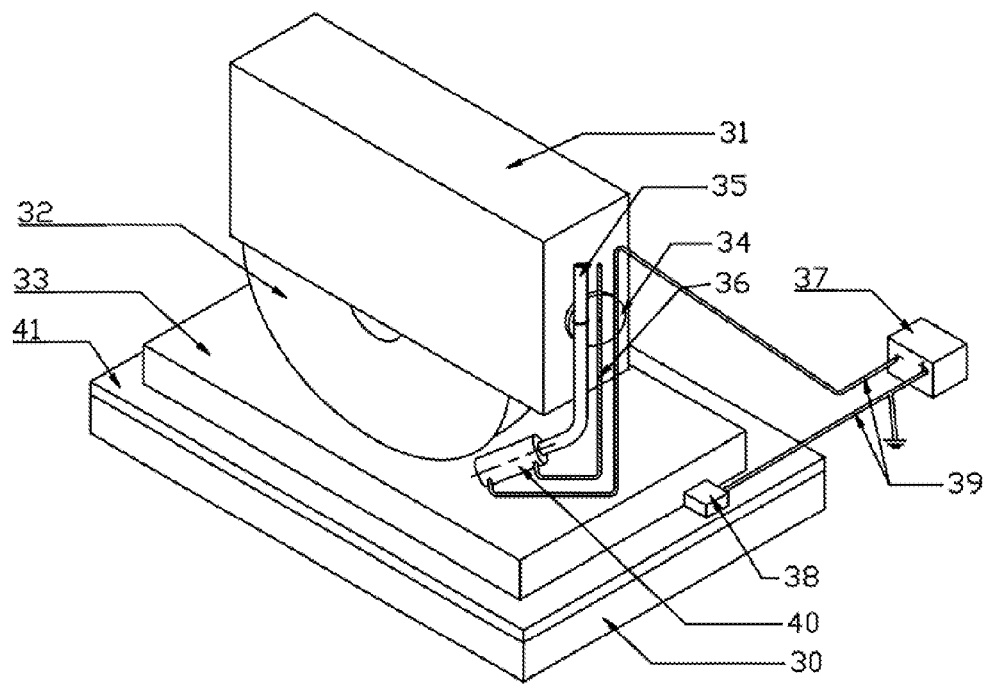
Figure 2:
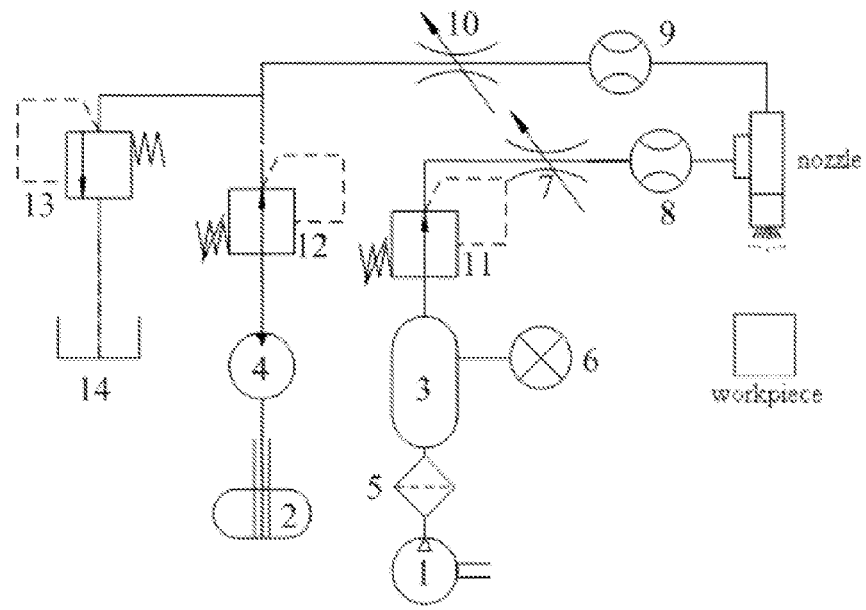

(51) Int. Cl.
   *B05B 7/04*     (2006.01)
   *B05B 7/10*     (2006.01)
   *H01J 37/32*    (2006.01)

(52) U.S. Cl.
   CPC .............. *B05B 7/10* (2013.01); *B24B 55/02* (2013.01); *H01J 37/3244* (2013.01); *H01J 37/32073* (2013.01); *H01J 37/32568* (2013.01); *H01J 37/32697* (2013.01); *H01J 2237/327* (2013.01)

(56) References Cited

FOREIGN PATENT DOCUMENTS

| | | |
|---|---|---|
| CN | 102873593 A | 1/2013 |
| CN | 103072084 A | 5/2013 |
| CN | 203045534 U | 7/2013 |
| JP | 2003106496 A | 4/2003 |
| JP | 2006102831 A | 4/2006 |
| WO | 2004087376 A1 | 10/2004 |

\* cited by examiner

NANO FLUID ELECTROSTATIC ATOMIZATION CONTROLLABLE JET MINIMAL QUANTITY LUBRICATION GRINDING SYSTEM

FIELD OF THE INVENTION

The present invention relates to a grinding liquid supply device in machining, and in particular relates to a nano fluid electrostatic atomization controllable jet minimal quantity lubrication grinding system.

BACKGROUND OF THE INVENTION

A minimal quantity lubrication technology is also called as an MQL (Minimal Quantity Lubrication) technology, which is used for mixing and atomizing minimal quantity lubricant and compressed air with certain pressure, and spraying the mixture to a grinding area to effectively lubricate contact surfaces between a grinding wheel and abrasive dust and between the grinding wheel and a workpiece. Under the premise of ensuring effective lubricating and cooling effects, minimal grinding liquid (about parts per thousand of the consumption of a traditional pouring-type lubricating manner) is used in the technology, to reduce cost, pollution to the environment and harm to human bodies.

Nano particles jet minimal quantity lubrication is established on the basis of the enhanced heat exchange theory, and it could be known from the enhanced heat exchange theory that the heat transfer capability of solid is further greater than that of liquid and gas. The heat conductivity coefficient of a solid material at normal temperature is a few orders of magnitude greater than that of a fluid material. By adding solid particles into a minimal quantity lubrication medium, the heat conductivity coefficient of a fluid medium may be significantly improved, the capability of convection heat transfer may be improved, and the defect of insufficient minimal quantity lubrication cooling capability is greatly overcome. Moreover, nano particles (indicating superfine minimal solid particles of which the size is 1-100 nm) also have special tribological properties of wear resistance, friction reduction, high bearing capability and the like in the aspects of lubrication and tribology. The nano jet minimal quantity lubrication indicates that nano-scale solid particles are added into a minimal quantity lubrication fluid medium to prepare nano fluid, namely nano particles, lubricant (oil or oil-water mixture) and high pressure gas are mixed and atomized and then sprayed to a grinding area in the form of jet flow.

Inventors carried out deep theoretical analysis and experimental verification on a minimal quantity lubrication grinding liquid supply system, and have applied for relevant patents with respect to the research results. The invention patent with an application number of 201210153801.2 applied by the invention designers discloses a nano particle jet minimal quantity lubrication grinding liquid supply system, wherein nano solid particles are added into degradable grinding liquid to prepare a minimal quantity lubrication grinding liquid, the lubricant is turned into pulse liquid drops with fixed pressure, variable pulse frequency and invariable liquid drop diameter by a minimal quantity supply device, and the pulse liquid drops are sprayed in the form of jet flow to a grinding area under the action of an air isolating layer generated by high pressure gas. However, in the invention patent with an application number of 201210153801.2, jet flow controllable minimal liquid drops are not produced in the form of electrostatic atomization, and the atomization principle and the liquid drop control manner are different. The invention patent with an application number of 201110221543.2 discloses a nano particle jet flow minimal quantity lubrication grinding three-phase stream supply system, wherein nano fluid is conveyed to a nozzle through a liquid path, meanwhile, high pressure gas enters the nozzle through a gas path, the high pressure gas and the nano fluid are fully mixed and atomized in a mixing chamber of the nozzle, are accelerated in an accelerating chamber and then enter a swirl chamber, meanwhile, compressed gas enters from vents of the swirl chamber, the three-phase stream is further mixed and accelerated by rotating, and then the three-phase stream is sprayed in the form of atomized liquid drops to a grinding area through the outlet of the nozzle. However, in the disclosed technical scheme, charged minimal fog drops are also not formed by adopting the principle of electrostatic atomization, controllable jet flow may not be realized, and the atomization principle and the liquid drop control manner are different.

At present, the minimal quantity lubricant in the minimal quantity lubrication grinding may not be effectively and controllably injected into the grinding area, namely a wedge-shaped area of a grinding wheel/workpiece interface under the carrying effect of the high pressure gas, so nano jet flow would be emitted to the ambient environment. Nowadays, we are paying high attention to the influence of lubricating liquid and cooling liquid on the health of operators during minimal quantity lubricant machining, e.g., the operators may suffer from various respiratory system diseases including occupational asthma, allergic pneumonia and lung dysfunction and skin diseases such as allergy, oil acne, skin cancer and the like. Latent health hazards brought to the operators by fog drops using air as power are industrially concerned in minimal quantity lubrication. When compressed air is used as power of spraying in the minimal quantity lubrication, the sprayed fog drops are no longer constrained, the motion of the fog drops are no longer controllable, and a series of problems such as diffusion, drift and the like are produced. However, due to these problems, the minimal fog drops are diffused to the working environment, to cause great pollution to the environment and great health hazard to workers. When the fog drops are less than 4 μm, various occupational diseases are even caused. According to practical reports, even if the workers are exposed in such an environment for a short time, the lung function may also be destroyed. Thus, the National Institute for Occupational Safety and Health in the United States suggests that the exposure limit concentration of mineral oil fog drops is 0.5 mg/m$^3$. To ensure the health of the workers, the minimal liquid drops in the minimal quantity lubrication process must be controlled, to reduce the diffusion quantity. However, in view of the existing retrieved documents, researches on such aspect have not been reported, so researches on the above problems are extremely urgent. Based on the current situation, controllable distribution of the minimal fog drops in the minimal quantity lubrication process is explored.

SUMMARY OF THE INVENTION

For solving the above problems to a certain extent, the present invention provides a nano fluid electrostatic atomization controllable jet minimal quantity lubrication grinding system, which may realize controllable distribution of spayed fog drops through the electrostatic principle, improve the uniformity and deposition efficiency of fog drop spectra and the effective utilization rate of liquid and effectively control the motion law of the fog drops, so as to reduce pollution to the environment and provide better health security to workers.

To fulfill the above purposes, the present invention adopts the following technical schemes.

A nano fluid electrostatic atomization controllable jet minimal quantity lubrication grinding system includes a grinding system, wherein the grinding system is provided with a corona charging nozzle, a nozzle body of the corona charging nozzle is connected with a liquid supply system and an air supply system, a high-voltage direct-current electrostatic generator at the lower part of the nozzle body is connected with the cathode of an adjustable high-voltage direct-current power supply, the anode of the adjustable high-voltage direct-current power supply is connected with a workpiece charging device, and the workpiece charging device is attached to the non-machined surface of a workpiece. Nano fluid grinding liquid is fed into the corona charging nozzle through the liquid supply system, meanwhile, the air supply system feeds compressed air into the corona charging nozzle, the nano fluid grinding liquid is charged into controllable jet flow by the high-voltage direct-current electrostatic generator while being driven by the compressed air to be sprayed out and atomized from the nozzle body, and the controllable jet flow is controllably distributed to a grinding area of the machined workpiece under the actions of an electric field force and an aerodynamic force.

The high-voltage direct-current electrostatic generator includes an electrode tray arranged at the lower part of the corona charging nozzle, the electrode tray is made of an insulating material, a plurality of electrode slots are arranged along the circumference of the electrode tray, and needle electrodes are arranged in the electrode slots; a wire slot is formed in the pitch diameter of the electrode tray, a high-voltage wire is arranged in the wire slot, a high-voltage wire tray connecting through hole is formed in the electrode tray, each needle electrode is connected with the high-voltage wire, and the high-voltage wire is connected with the cathode of the adjustable high-voltage direct-current power supply; and a positioning thread ring is arranged at the lower part of the electrode tray, made of a ceramic material and provided with an external thread matched with the corona charging nozzle for positioning the electrode tray.

The workpiece charging device includes a workpiece charging device insulating shell, a weight, a permanent magnet and a pressure spring; the permanent magnet is arranged on the circumference of the workpiece charging device insulating shell; an opening is formed in the middle of the workpiece charging device insulating shell, and the weight extends out of the workpiece charging device insulating shell from one end and is matched with the pressure spring; a split pin slot for inserting a split pin is formed in the weight, and the weight is connected with the anode of the adjustable high-voltage direct-current power supply.

The adjustable high-voltage direct-current power supply includes a transformer, the primary winding of the transformer is connected with an alternating-current power supply, two wires of the secondary winding of the transformer are respectively used as a direct-current voltage stabilizing unit V1 and a direct-current voltage stabilizing unit V2, the direct-current voltage stabilizing unit V1 is connected with a self-excited oscillating circuit, the self-excited oscillating circuit is connected with a power amplifying circuit, a high-frequency pulse booster, a voltage doubling rectifying circuit and a constant-current automatic control circuit, the constant-current automatic control circuit is connected with the direct-current voltage stabilizing unit V2, and the direct-current voltage stabilizing unit V2 is connected with a power amplifying unit; the adjustable voltage range of the adjustable high-voltage direct-current power supply is 2-120 kV; the direct-current voltage stabilizing unit V1 provides a working voltage for the self-excited oscillating circuit, the direct-current voltage stabilizing unit V2 provides main energy for power conversion, pulse signals are acquired by the self-excited oscillating circuit, amplified by the power amplifying circuit and boosted by the high-frequency pulse booster, and high-voltage signals are finally output and processed through the voltage doubling rectifying circuit, so that a direct-current high voltage is output; the constant-current automatic control circuit is used for automatically sampling the electrostatic working current of the voltage doubling rectifying circuit, and during constant current, when a working load is normally enlarged, the working current does not rise; and when an external load exceeds the permissible current, the self-excited oscillating circuit stops oscillating, and the high voltage is cut off.

The atomized nano fluid grinding liquid collides with drifting electrons in a corona discharging drift area of the needle electrodes and then is charged, and the charged liquid drops are controllably sprayed to the surface of the workpiece under the actions of an electric field force, an aerodynamic force and gravity.

The needle electrodes are in interference fit with the electrode slots, and are clamped through elastic deformation of an insulating material.

The radius of the discharge point of each needle electrode is 0.5 mm, the inter-electrode distance is 20-30 cm, and the corona onset voltage is 15.2848-16.2064 kV.

The nozzle angle of the nozzle body is kept at 30° to 45°, and the jet distance between the outlet of the nozzle body and the workpiece is 20-30 cm.

The corona charging quantity of the fog drops is calculated as the following formula:

$$q = f\left[1 + 2\frac{k-1}{k+2}\right]4\pi\varepsilon_0 E r^2$$

in the formula, $$f = \frac{\frac{NeKi}{4\varepsilon_0}t}{\frac{NeKi}{4\varepsilon_0}t + 1}$$

q—fog drop charging quantity, C;
k—fog drop dielectric constant;
$\varepsilon_0$—air dielectric constant, about $8.85 \times 10^{-12}$, $c^2/n \cdot m^2$;
E—intensity of an electric field formed by corona charge, Vim;
r—fog drop radius, μm;
N—charged ion concentration, particle number/m²;
e—electron charge, $1.6 \times 10^{-19}$, C;
Ki—mobility of charged ions, $m^2/(V \cdot s)$;
t-charging detention time, s.

The liquid supply system is connected with the nozzle body through a nano fluid conveying snakelike pipe, and the air supply system is connected with the nozzle body through a compressed gas conveying snakelike pipe.

The system has the following beneficial effects: nano fluid is prepared by mixing nano solid particles and a lubricant, the nano fluid is sprayed to the grinding area in the form of jet flow after electrostatic atomization, and charged nano fluid fog drops controllably and orderly flow to a grinding wheel/workpiece interface, so that the nano particles may further participate in enhanced heat exchange and form a lubricating and anti-friction oil film on the grinding wheel/workpiece interface, drift loss of the small-diameter fog drops is effectively reduced, and low-carbon, clean and efficient minimal quantity lubrication grinding is realized.

After the fog drops sprayed out of the nozzle are charged, the fog drops move directionally under the action of the electric field force, so that maximum fog drops cover the surface of the workpiece. In the charging process, due to larger surface, stronger surface polarity and larger charge-to-mass ratio of the charged nano particles compared with the fog drops, the nano particles arrive at the surface of the workpiece early and are covered below the oil film, so that the ideal heat exchange capability of the nano particles may be better utilized. There is an "electrostatic surrounding" effect in an electrostatic field, and the fog drops and the nano particles enter the depressions on the rough surface of the workpiece more easily when moving to the workpiece, so that the relative coverage is enlarged, and better lubrication and heat exchange effects may be achieved.

The nano fluid is atomized by compressed air and high-voltage static electricity together, so that the particle diameter of the fog drops may be reduced. The nano fluid fog is charged under the action of the high-voltage static electricity, and may be effectively and directionally distributed in the grinding area under the action of the electric field force, so that the drift quantity of the fog is greatly reduced, the utilization rate of the nano fluid is improved to a great extent, then the lubricating and cooling effect is improved and the diffusion pollution of particles is reduced. After the fog is charged, the fog may be distributed more uniformly due to the mutually exclusive effect of like charges and the electrostatic surrounding effect.

BRIEF DESCRIPTION OF THE DRAWINGS

FIG. 1 is an assembly axonometric diagram of an embodiment;

FIG. 2 is a simple diagram of liquid path and gas path systems of an embodiment;

FIG. 3 is a block diagram of a circuit system of an embodiment;

FIG. 4 is a total assembly section view of a nozzle of an embodiment;

FIG. 5 is a section view of a nozzle body of an embodiment;

FIG. 6 is a section view indicating that the nozzle is turned to a vent in an embodiment;

FIG. 7 is a bottom view and a revolved section view of an electrode tray of an embodiment;

FIG. 8 is an internal wiring schematic diagram of the electrode tray of the embodiment;

FIG. 9 is a front view and a section view of a positioning thread ring of an embodiment;

FIG. 10 is a section view and a top view of a workpiece charging device of an embodiment;

in which, 1—air compressor, 2—liquid storage tank, 3—gas storage tank, 4—hydraulic pump, 5—filter, 6—pressure gauge, 7—throttling valve, 8—turbine flow meter I, 9—turbine flow meter II, 10—throttling valve, 11—pressure regulating valve I, 12—pressure regulating valve II, 13—overflow valve, 14—fluid recovery tank, 15—nozzle body, 16—electrode tray, 17—needle electrode, 18—positioning thread ring, 19—nano fluid inlet, 20—turning compressed gas passage, 21—built-in annular compressed gas passage, 22—nano fluid and compressed gas mixing chamber, 23—compressed gas inlet, 24—swirl chamber compressed gas passage, 25—three-phase stream accelerating chamber, 26—swirl chamber, 27—high-voltage wire passage, 28—high-voltage wire tray pull-out through hole, 29—tightening slot, 30—partial workbench, 31—grinding wheel guard, 32—grinding wheel, 33—workpiece, 34—magnetic sucking disc, 35—nano fluid conveying snakelike pipe, 36—compressed gas conveying snakelike pipe, 37—adjustable high-voltage direct-current power supply, 38—workpiece charging device, 39—high-voltage wire, 40—nozzle, 41—insulating plate, 42—high-voltage wire in the electrode tray, 43—workpiece charging device insulating shell, 44—weight, 45—permanent magnet, 46—pressure spring, 47—split pin slot.

DETAILED DESCRIPTION OF THE EMBODIMENTS

The present invention will be described below in combination with the accompanying drawings.

As shown in FIG. 1, an insulating plate 41 (this novel material may be magnetic but nonconductive, so that installation of a workpiece may be ensured and a stable electric field may be formed between a nozzle and the workpiece) covers a partial workbench 30 of a grinding machine. A magnetic sucking disc 34 attracts the lateral surface of a grinding wheel guard 31, and is used for fixing a nano fluid conveying snakelike pipe 35, a compressed gas conveying snakelike pipe 36 and a high-voltage wire 39 connected with the nozzle. One end of the nano fluid conveying snakelike pipe 35 is connected with a nano fluid inlet 19, and the other end of the nano fluid conveying snakelike pipe 35 is connected with a turbine flow meter II 9. One end of the compressed gas conveying snakelike pipe 36 is connected with a compressed gas inlet 23, and the other end of the compressed gas conveying snakelike pipe 36 is connected with a turbine flow meter I 8. One end of the high-voltage wire 39 penetrates through a high-voltage wire passage 27 and a high-voltage wire tray pull-out through hole 28 and is connected with the tail of each needle electrode 17 in an electrode tray 16, and the other end of the high-voltage wire 39 is connected with the cathode output end of an adjustable high-voltage direct-current power supply 37. One end of the other high-voltage wire 39 is connected with a weight 44, and the other end of the other high-voltage wire 39 is connected with the anode output end of the adjustable high-voltage direct-current power supply 37 and grounded. A workpiece charging device 38 is attached to the non-machined surface of the workpiece 33, so that the workpiece is connected with the anode of the adjustable high-voltage direct-current power supply 37.

As shown in FIG. 2, since the nozzle used in the present invention is a pneumatic nano fluid fog charging nozzle, nano fluid grinding liquid and compressed air are respectively introduced into the nozzle through a liquid passage and a gas passage in this scheme and mixed in the nozzle, and then fog drops sprayed out of the nozzle are charged by using a corona charging method. The gas passage is formed by an air compressor 1, a filter 5, a gas storage tank 3, a pressure regulating valve I 11, a throttling valve 7 and a turbine flow meter I 8. The liquid passage is formed by a liquid storage tank 2, a hydraulic pump 4, a pressure regulating valve II 12, a throttling valve 10 and a turbine flow meter II 9. The adjustable high-voltage direct-current power supply 37 supplies high-voltage negative electricity to the needle electrodes 17. Compressed air produced by the air compressor 1 enters the gas storage tank 3 through the filter 5, flows through the turbine flow meter I 8 through the pressure regulating valve I 11 and the throttling valve 7 and enters the compressed gas inlet 23; and nano fluid in the liquid storage tank 2 is pumped out by the hydraulic pump 4, flows through the turbine flow meter II 9 through the pressure regulating valve II 12 and the throttling valve 10 and enters the nano fluid inlet 19. An overflow valve 13 and a fluid recovery tank 14 form a protective loop, and a pressure gauge 6 is used for monitoring the gas pressure of the gas storage tank 3.

Figure 3:
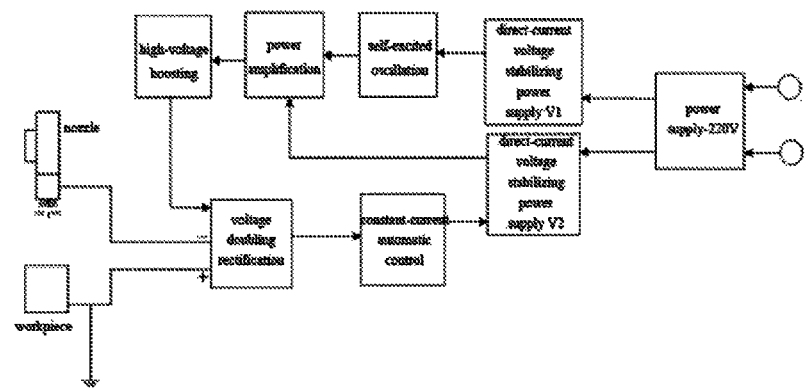

As shown in FIG. 3, the adjustable high-voltage direct-current power supply 37 consists of an alternating-current power supply unit, a direct-current voltage stabilizing unit V1, a direct-current voltage stabilizing unit V2, a self-excited oscillating circuit, a power amplifying circuit, a high-frequency pulse booster, a voltage doubling rectifying circuit and a constant-current automatic control circuit.

Figure 4:
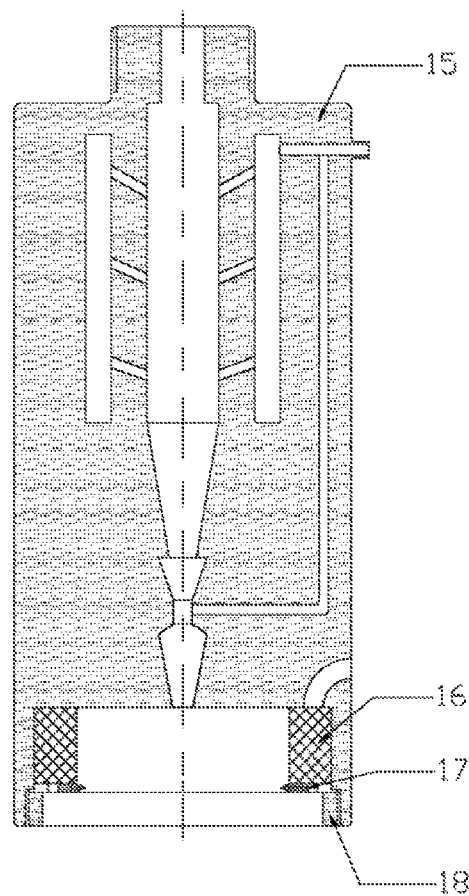
Figure 5:
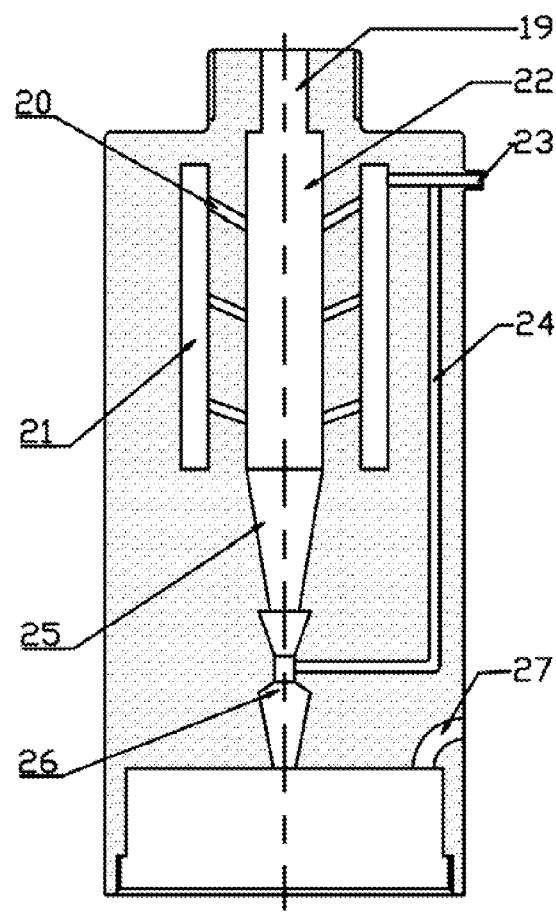
Figure 6:
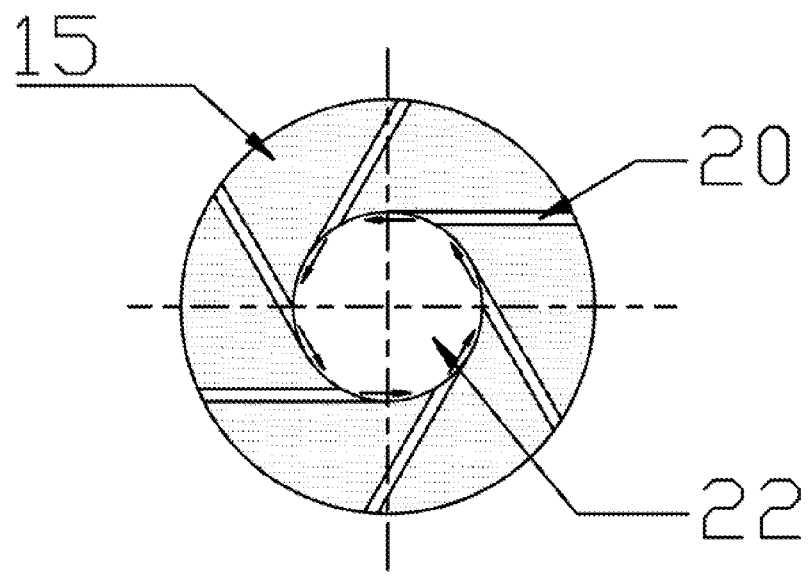

As shown in FIGS. 4 and 5, the nozzle body 15 is complex in structure and unlikely to manufacture and is required to have certain insulating performance, so the nozzle body 15 is manufactured by using a ceramic material through a quick molding process. Compressed gas entering from the compressed gas inlet 23 flows through a built-in annular compressed gas passage 21, enters a mixing chamber at a certain tangential velocity v through a turning compressed gas passage 20 and is mixed with nano fluid entering from the nano fluid inlet 19 to form a three-phase stream, the three-phase stream is accelerated in a three-phase stream accelerating chamber 25, the accelerated three-phase stream enters a swirl chamber 26 and forms swirl therein together with compressed air entering through a swirl chamber compressed gas passage 24, and the three-phase stream is further mixed and then sprayed out through the outlet of the nozzle body 15 to form fog drops. The sprayed fog drops pass through a corona discharging drift area of the needle electrodes 17 and collide with drifting electrons so as to be charged, and the charged liquid drops are controllably sprayed to the surface of the workpiece under the actions of an electric field force, an aerodynamic force and gravity.

As shown in FIG. 6, the turning compressed gas passage 20 is arranged along the outer wall of the mixing chamber, the inlet axis of the turning compressed gas passage 20 is tangent with the wall of the inner cavity of the mixing chamber, and compressed gas enters the nano fluid and compressed gas mixing chamber 22 at the tangential velocity v through a turning vent.

As shown in FIG. 7, the electrode tray 16 is made of an insulating material and provided with eight electrode slots along the circumference, a wire slot is formed in the pitch diameter of the electrode tray 16, and a high-voltage wire tray pull-out through hole 28 is also formed in the electrode tray 16.

As shown in FIG. 8, the needle electrodes 17 (which are in interference fit with the electrode slots and are clamped through elastic deformation of the insulating material) are arranged in the electrode slots, the needle electrodes 17 are connected in series with each other by a high-voltage wire in the electrode tray 42, and high-voltage wire in the electrode tray 42 is pulled out from the high-voltage wire tray pull-out through hole 28.

As shown in FIG. 9, the positioning thread ring 18 is also made of the ceramic material and provided with an external thread matched with the nozzle body 15, and two tightening slots 29 facilitating installation are formed at the lower end of the positioning thread ring. The positioning thread ring 18 mainly plays a role in positioning the electrode tray 16.

As shown in FIG. 10, the workpiece charging device 38 consists of a workpiece charging device insulating shell 43, a weight 44, a permanent magnet 45 and a pressure spring 46. When the workpiece charging device 38 approaches the non-machined surface of the workpiece, the permanent magnet 45 attracts the workpiece 33 to compress the pressure spring 46, and the pressure spring 46 provides a counterforce, so as to ensure that the weight 44 is tightly connected with the workpiece 33. A split pin slot 47 for inserting a split pin is formed in the weight 44, to ensure that the weight 44 and the pressure spring 46 may not fall from the workpiece charging device insulating shell 43 when the workpiece charging device 38 does not attract the workpiece 33.

The specific working process of this scheme is as follows.

Nano fluid enters the nano fluid inlet 19 through the liquid passage formed by the liquid storage tank 2, the hydraulic pump 4, the pressure regulating valve II 12, the throttling valve 10 and the turbine flow meter II 9; and compressed air enters the compressed gas inlet 23 through the gas passage formed by the air compressor 1, the filter 5, the gas storage tank 3, the pressure regulating valve I 11, the throttling valve 7 and the turbine flow meter I 8. The nano fluid and the compressed air simultaneously enter the nano fluid and compressed gas mixing chamber 22. The aperture size of the nano fluid and compressed gas mixing chamber 22 is greater than that of the nano fluid inlet 19, to ensure a mixing space. The inlet axis of the turning compressed gas passage 20 is tangent with the wall of the inner cavity of the nano fluid and compressed gas mixing chamber 22, the compressed air enters the nano fluid and compressed gas mixing chamber 22 at the tangential velocity v through the vent, and the velocity direction of the compressed air is not crossed with the axial center, so that inlet airflow forms a moment of momentum in the axial center, and the airflow rotates around the axial center in the passage and is boosted to the outlet at the same time to drive the nano fluid to rotate to form swirl.

The nano fluid enters the conical converging three-phase stream accelerating chamber 25 after flowing out of the nano fluid and compressed gas mixing chamber 22, and is accelerated. The accelerated three-phase stream flows into the swirl chamber 26. The inner wall of the swirl chamber 26 is formed by a cylindrical surface and two conical surfaces which have different included angles with the axis, and the compressed air enters the cylindrical area with smallest diameter from the swirl chamber compressed gas passage 24 and is immediately diffused to the two adjacent conical areas with larger diameters. This is bound to diffuse the swirl, so that the three-phase stream is further mixed. The further mixed three-phase stream is sprayed out of the outlet of the nozzle to form fog.

Two, four or eight needle electrodes 17 may be clamped in the electrode slots of the electrode tray 16 as required. The radius of the discharge point of each needle electrode 17 is 0.5 mm. The needle electrodes 17 are connected with the high-voltage wire 39, and the high-voltage wire 39 is pulled out of the nozzle body 15 through the high-voltage wire tray pull-out through hole 28 and the high-voltage wire passage 27 and connected with the cathode output end of the adjustable high-voltage direct-current power supply 37. Because the corona onset voltage of negative corona discharge is low and the breakdown voltage is high during corona discharge, the needle electrodes 17 are connected with the cathode of the power supply; and the anode output end of the adjustable high-voltage direct-current power supply 37 is connected with the workpiece charging device 38 through the high-voltage wire 39 and grounded.

As the area of the workpiece 33 is relatively large, the needle electrodes 17 and the workpiece form a needle-plate structure. Thus, an extremely non-uniform electric field is formed (condition of corona discharge). The electrostatic corona atomization adopts multi-polar needle discharge, the points of the electrodes do not affect mutual corona onset voltages due to long relative distance, but when the electrodes are simultaneously subjected to the corona discharge, the electron and ion concentration between the electrodes and the workpiece may be greatly improved, so that the charging efficiency of the fog drops may be improved; and after the electric fields of the electrodes are compounded, the electric field force borne by the fog drops is also enhanced, which is more favorable for directional motion of the fog drops. The adjustable voltage range of the adjustable high-voltage direct-current power supply 37 is 2-120 kV. As pd is greater than 26.66 kPa-cm (p is the external air pressure of a working condition, and d is the distance between the needle electrodes) in the working condition, the stream theory rather than the Thomson theory is utilized for analysis. When a voltage which is relatively high but does not reach the breakdown voltage is applied to the two ends of the needle electrodes 17, if the electric field (local electric field) nearby the surface of each electrode is very strong, the gas medium nearby the electrode is locally broken down to produce corona discharging. The pressure of the gas herein is about 10 Pa. When the curvature radius of an electrode is very small, because the field intensity nearby the electrode is particularly high, corona discharge easily happens.

In the extremely non-uniform electric field, before air gaps are completely broken down, corona discharge happens nearby the electrodes, and dark blue halation is produced. The special halation is produced in the discharging process of an ionization zone on the surface of the electrodes. Molecules in the ionization zone are excited and ionized under the actions of external ionization factors (such as a light source) and the electric field to form a large amount of electron avalanche. Meanwhile, a reversible process of excitation and ionization, namely compounding, is also produced. In the compounding process, light radiation is produced, so that the halation is formed. The halation is corona. The current intensity of corona discharge depends on an external voltage, the shape of the electrodes, the inter-electrode distance, the properties and density of gas and the like.

When the potential difference between two electrodes is greatly increased from zero, silent non-self-maintained discharge initially happens, the current at the moment is very weak, and the intensity of the current determines f residual ionization; and when the voltage is increased to a certain value $V_s$, corona discharge happens. The voltage $V_s$ is called as a corona onset voltage or a threshold voltage of the corona discharge, and the magnitude of the voltage $V_s$ is characterized by sudden increase (from about $10^{-14}$ to $10^{-6}$) of the current between the electrodes and appearance of hazy glow at the electrodes with smaller curvature radii.

The calculation formula of threshold field intensity is as follows:

$$(E_r) = E_0 m \delta [1+K/(\delta r)]^{1/2} \quad (1)$$

in the formula, $(E_r)$, is a threshold field, $E_0=3100$ kV/m (this value is equivalent to spark field intensity in a uniform field when the discharge gap in air under the standard state is 1 cm), m is a coefficient (0.6<m<1) for describing the surface state of a conductor, $\delta$ is the relative density of air: $\delta=2.94\times 10^{-3}$ P/(273+T) (the unit of P is Pa, and when P is equal to 101325 Pa and T is equal to 25° C., $\delta=1$), K is equal to $3.08\times10^{-2}$ m$^{1/2}$, and r is the radius of an electrode end.

For the electrodes with different curvatures, such as needle-plate electrodes, the calculation formula is as follows:

$$(E_r)_s = E_0\left(1 + \frac{K}{(r/2)^{1/2}}\right) \quad (2)$$

the values $E_0$ and K herein are the same as those in formula (1), and m and $\delta$ are 1.

The formula is suitable for a cathode or an anode with small curvature radius.

The threshold value is calculated as follows:

Needle-plane clearance of a paraboloid, the radius of a needle top is r, the clearance distance is d, and the electric field intensity at $\chi$ away from the needle top along the clearance axis is:

$$Ex = \frac{2V}{(r+2x)\ln[(r+2d)/r]} \quad (3)$$

The threshold voltage is:

$$V_s=(E_r)_s(r/2)\ln\ [(r+2d)/r] \quad (4)$$

Aiming at the machining condition of the grinding machine, it is supposed that the point radius of each needle electrode 17 is 0.5 mm, and the inter-electrode distance is 20-30 cm (when the distance is more than 30 cm, the effect of the electric field force starts fading). The corona onset voltage calculated according to formula (4) is 15.2848-16.2064 kV.

When corona discharge happens, if the potential difference is continuously increased, the current intensity is improved, and the size and brightness of a luminous layer are also improved. When an external voltage is higher than the threshold voltage, the corona discharge is converted into spark discharge, namely breakdown of spark happens.

The angle of the nozzle is kept at 30° during grinding, and when the distance between the nozzle and the workpiece is 20 cm, the shortest distance between the nozzle and the workpiece is 20 sin 30°=10 cm (vertical distance between the nozzle and the workpiece). When the air pressure p of the working environment is $10^5$ Pa, the spark breakdown voltage is 265 kV when d is 10 cm and 510 kV when d is 20 cm according to the table. It is thus clear that the spark breakdown voltage is very high.

The electrostatic liquid drop atomization mechanism is as follows.

Electrostatic atomization indicates a phenomenon that an electrostatic force overcomes liquid surface tension so that liquid is broken into minimal fog drops. Due to the corona discharge effect, the surfaces of liquid drops carry a large number of like charges under the "skin effect", so that the surface activity of the liquid is improved, surface molecules are significantly directionally arranged, and the surface tension is reduced. Under the condition that the volume of the liquid drops is not changed, the surface tension is gradually reduced with the increase of the electric quantity of the charges. When the surface tension is insufficient to constrain the liquid, the liquid is broken into the minimal fog drops under the mutually exclusive effect between the like charges on the surface and the liquid surface disturbance caused by an external force.

When the liquid drops have higher velocity relative to the surrounding gas, breakage of the liquid drops is controlled by pneumatic pressure, surface tension and viscosity. For the liquid with lower viscosity, the breakage of the liquid drops is mainly determined by the pneumatic pressure and the surface tension. The pneumatic pressure borne by large liquid drops is $0.5\rho_g \Delta V^2$, wherein $\rho_g$ is gas density, and $\Delta V$ is gas-liquid relative velocity. However, the cohesion produced by the surface tension would hinder deformation breakage of the liquid drops, and the cohesion may be expressed as $4\sigma/D$, wherein $\sigma$ is inherent surface tension of the liquid, and D is the diameter of initial liquid drops.

When the diameter of the liquid drops is reduced, the cohesion is increased; when the cohesion is balanced to the tensile stress caused by the pneumatic pressure, the liquid drops are kept stable; and if the cohesion and the tensile stress may not be counteracted with each other, the liquid drops would be deformed and even broken. According to the principle that the tensile stress produced by the pneumatic pressure acting on the liquid drops is balanced to the cohesion produced by the surface tension, a non-dimensional number may be obtained:

$$We = \frac{\rho_g \Delta V^2 D}{\sigma} = 8 \qquad (5)$$

It could be known that, when the Weber number is more than 8, the stress of the liquid drops is unbalanced, and the liquid drops are deformed. In addition, the maximum steady-state liquid drop diameter corresponding to the $\Delta V$ may be solved according to formula (5):

$$D_{max} = \frac{8\sigma}{\Delta V^2 \rho_g} \qquad (6)$$

The surface tension of the charged liquid drops is weakened under the action of Coulomb repulsion, and the weakened surface tension value is:

$$\sigma' = \sigma - \frac{q^2}{64\pi^2 \varepsilon r^3} \qquad (7)$$

wherein r is the radius of the liquid drops, q is the charge quantity of the liquid drops, and $\in$ is a dielectric constant of surrounding air. It could be obviously seen from the formula that, when the charge quantity q is increased, the surface tension declines, so the surface charges of the liquid drops are beneficial to atomization.

At the moment, We of the charged liquid drops may be expressed as:

$$We = \frac{\rho_g \Delta V^2 D}{\sigma - \frac{q^2}{64\pi^2 \varepsilon r^3}} = \frac{128\pi^2 \varepsilon R^4 \rho_g \Delta V^2}{64\pi^2 \varepsilon R^3 \sigma - q^2} \qquad (8)$$

According to formula (8), the breakage of the charged liquid drops in high-speed airflow is closely related to the gas-liquid relative velocity, gas-liquid physical property parameters and a charging field. Moreover, if the liquid drops reach a stable state in the airflow, after the liquid drops are charged with static electricity, the We is increased, the surface tension of the liquid is reduced and is insufficient to resist against the pneumatic pressure, and the liquid drops are further deformed and broken, so under the condition that the gas-liquid parameters are identical, the diameter of the fog drops charged with static electricity is smaller. Thus, the fog drops are thinned, and the same charges on the surfaces of the liquid drops may ensure that the liquid drops are distributed more uniformly.

The liquid drop charging mechanism is as follows.

When negative corona discharge happens at the points of the needle electrodes 17, a large number of ions are generated in a corona area, the positive ions move to the cathodes of the electrodes and are electrically neutralized, whereas the negative ions and electrons move to the anodes, enter a drift area, collide with the liquid drops in the drift area and are attached to the liquid drops, so that the liquid drops become charge carriers carrying charges with the same polarities as the electrodes.

The corona charging quantity of the fog drops is calculated as the following formula:

$$q = f\left[1 + 2\frac{k-1}{k+2}\right] 4\pi\varepsilon_0 E r^2 \qquad (9)$$

In formula (9), $$f = \frac{\frac{NeKi}{4\varepsilon_0}t}{\frac{NeKi}{4\varepsilon_0}t + 1} \qquad (10)$$

q—fog drop charging quantity, C;
k—fog drop dielectric constant;
$\in_0$—air dielectric constant, about $8.85 \times 10^{-12}$, $c^2/n \cdot m^2$;
S—intensity of an electric field formed by corona charge, Vim;
r—fog drop radius, μm;
N—charged ion concentration, particle number/m²;
e—electron charge, $1.6 \times 10^{-9}$, C;
Ki—mobility of charged ions, $m^2/(V \cdot s)$;
t—charging detention time, s.

The fog drops sprayed out from the nozzle move to the workpiece in an accelerated manner under the actions of the aerodynamic force and the electric field force, at the speed of about 50-70 m/s. The distance between the nozzle and the workpiece is 20-30 cm, so the movement time is 0.0029 s-0.006 s. However, the time required for charging the fog drops is merely $10^{-7}$ s to $10^{-6}$ s, so that the oil fog sprayed out from the nozzle may be fully charged before arriving at the workpiece.

After the fog drops sprayed out from the nozzle are charged, the fog drops directionally move under the action of the electric field force, and maximum fog drops cover the surface of the workpiece. In the charging process, due to larger surface, stronger surface polarity and larger charge-to-mass ratio of the charged nano particles compared with the fog drops, the nano particles arrive at the workpiece early and are covered below an oil film, so that the ideal heat exchange capability of the nano particles may be better utilized. There is an "electrostatic surrounding" effect in an electrostatic field, and the fog drops and the nano particles enter the depressions on the rough surface of the workpiece more easily when moving to the workpiece, so that the relative coverage is enlarged, and better lubrication and heat exchange effects may be achieved.

Figure 7:
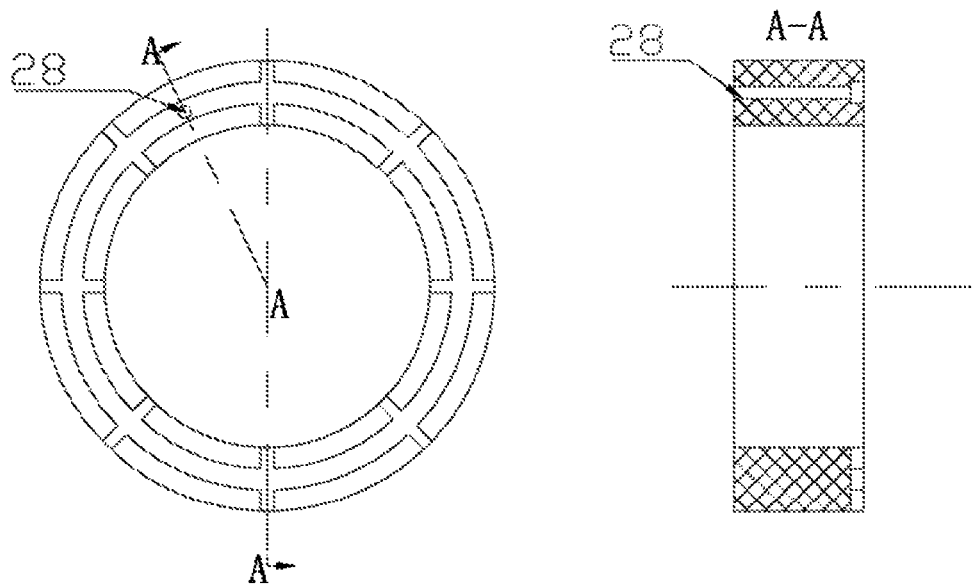
Figure 8:
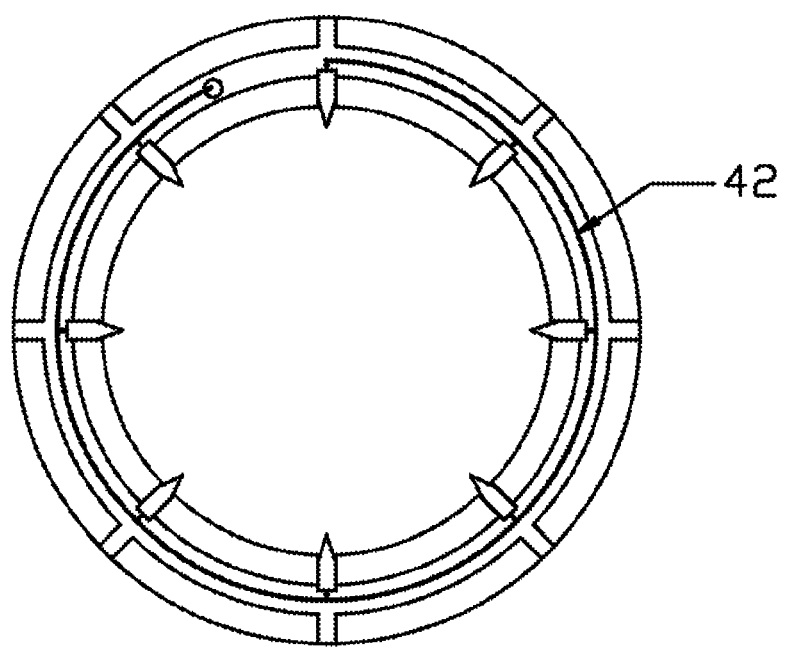
Figure 9:
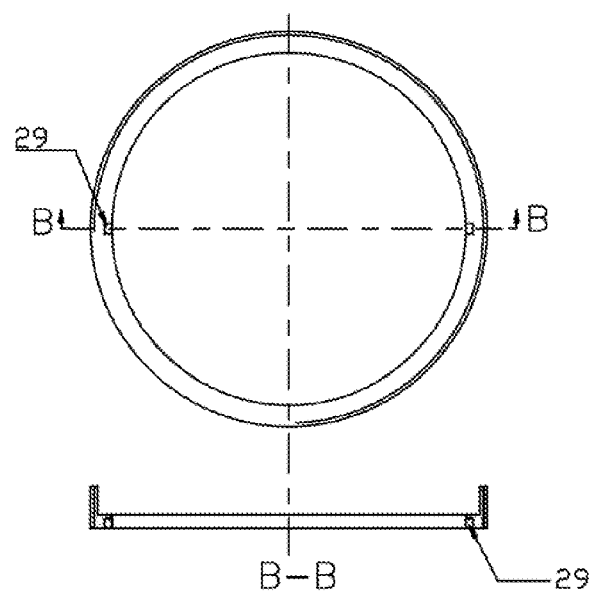
Figure 10:
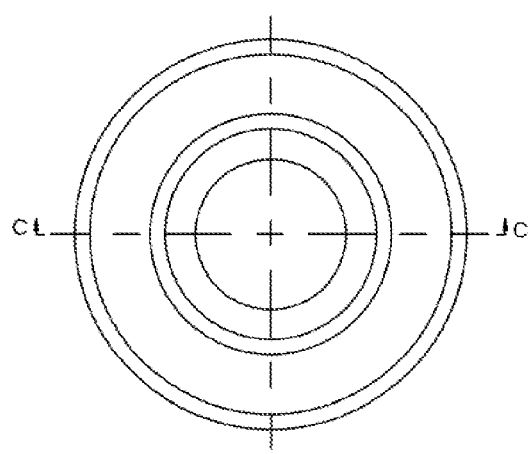
Figure 10:
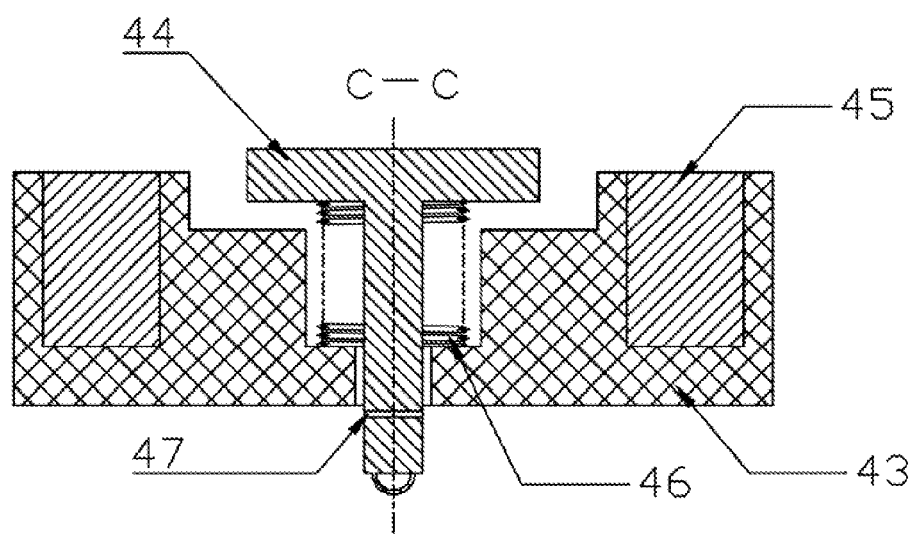

It could be seen from FIG. 7 that, the adjustable high-voltage direct-current power supply 37 consists of a self-excited oscillating circuit, a power amplifying circuit, a high-frequency pulse booster, a voltage doubling rectifying circuit, a direct-current voltage stabilizing unit V1, a direct-current voltage stabilizing unit V2 and a constant-current automatic control circuit. According to the working principle of the power supply 37, the input end is connected with an alternating-current power supply, and the direct-current voltage stabilizing unit V1 and the direct-current voltage stabilizing unit V2 provide direct-current voltages. The direct-current voltage stabilizing unit V1 provides a working voltage for the self-excited oscillating circuit, the direct-current voltage stabilizing unit V2 provides main energy for power conversion, the high-frequency pulse booster acquires high-voltage static electricity through rectification of the voltage doubling rectifying circuit, base pulse signals are acquired from the self-excited oscillating circuit, amplified by the power amplifying circuit and boosted by the high-frequency pulse booster, and high-voltage signals are finally output and processed through the voltage doubling rectifying circuit, so that a direct-current high voltage is output.

The power supply has the characteristics that a high electrostatic high voltage may be generated, and the power supply current is minimal and generally does not exceed 500 μA. The constant-current automatic control circuit is used for automatically sampling the electrostatic working current of the voltage doubling rectifying circuit, and during constant current, when a working load is normally enlarged, the working current does not rise. When an external load exceeds the permissible current, the self-excited oscillating circuit stops oscillating, and the high voltage is cut off. This characteristic is reliable for the safety of operators. Once an operator approaches or touches a high-voltage end, the shock current is weak, meanwhile, the high-voltage output is cut off, so life risks are avoided.

The invention claimed is:

1. A nano fluid electrostatic atomization controllable jet minimal quantity lubrication grinding system, comprising a grinding system, wherein the grinding system is provided with a corona charging nozzle, a nozzle body of the corona charging nozzle is connected with a liquid supply system and an air supply system, a high-voltage direct-current electrostatic generator at the lower part of the nozzle body is connected with a cathode of an adjustable high-voltage direct-current power supply, an anode of the adjustable high-voltage direct-current power supply is connected with a workpiece charging device, and the workpiece charging device is attached to a non-machined surface of a workpiece, wherein the nano fluid, which is used as a grinding liquid, is fed into the corona charging nozzle through the liquid supply system, meanwhile, the air supply system feeds compressed air into the corona charging nozzle, the nano fluid grinding liquid is charged into a controllable jet stream by the high-voltage direct-current electrostatic generator while being driven by the compressed air to be sprayed out and atomized from the nozzle body, and the controllable jet stream is controllably distributed to grinding area of the machined workpiece under the actions of an electric field force and an aerodynamic force, wherein the high-voltage direct-current electrostatic generator comprises an electrode tray arranged at the lower part of the corona charging nozzle, the electrode tray is made of an insulating material, a plurality of electrode slots are arranged along the circumference of the electrode tray, and needle electrodes are arranged in the electrode slots; a wire slot is formed in the pitch diameter of the electrode tray, a high-voltage wire is arranged in the wire slot, a high-voltage wire tray connecting through hole is formed in the electrode tray, each needle electrode is connected with the high-voltage wire, and the high-voltage wire is connected with the cathode of the adjustable high-voltage direct-current power supply; and a positioning thread ring is arranged at the lower part of the electrode tray, made of a ceramic material and provided with an external thread matched with the corona charging nozzle for positioning the electrode tray.

2. The nano fluid electrostatic atomization controllable jet minimal quantity lubrication grinding system of claim 1, wherein the atomized nano fluid grinding liquid collides with drifting electrons in a corona discharging drift area of the needle electrodes and then is charged, and charged liquid drops are controllably sprayed to the surface of the workpiece under the actions of an electric field force, an aerodynamic force and gravity.

3. The nano fluid electrostatic atomization controllable jet minimal quantity lubrication grinding system of claim 1, wherein the needle electrodes are in interference fit with the electrode slots, and are clamped through elastic deformation of an insulating material.

4. The nano fluid electrostatic atomization controllable jet minimal quantity lubrication grinding system of claim 3, wherein a radius of the discharge point of each needle electrode is 0.5 mm, an inter-electrode distance is 20-30 cm, and a corona onset voltage is 15.2848-16.2064 kV.

5. The nano fluid electrostatic atomization controllable jet minimal quantity lubrication grinding system of claim 1, wherein a radius of the discharge point of each needle electrode is 0.5 mm, an inter-electrode distance is 20-30 cm, and a corona onset voltage is 15.2848-16.2064 kV.

6. The nano fluid electrostatic atomization controllable jet minimal quantity lubrication grinding system of claim 1, wherein a nozzle angle of the nozzle body is kept at 30° to 45°, and a jet distance between the outlet of the nozzle body and the workpiece is 20-30 cm.

7. The nano fluid electrostatic atomization controllable jet minimal quantity lubrication grinding system of claim 1, wherein a corona charging quantity of fog drops is calculated as the following formula:

$$q = f\left[1 + 2\frac{k-1}{k+2}\right]4\pi\varepsilon_0 Er^2$$

in the formula, $$f = \frac{\frac{NeKi}{4\varepsilon_0}t}{\frac{NeKi}{4\varepsilon_0}t + 1}$$

q—fog drop charging quantity, C;
k—fog drop dielectric constant;
$\varepsilon_0$—air dielectric constant, about $8.85 \times 10^{-12}$, $c^2/n \cdot m^2$;

E—intensity of an electric field formed by corona charge, V/m;
r—fog drop radius, μm;
N—charged ion concentration, particle number/m$^2$;
e—electron charge, $1.6 \times 10^{-19}$, C;
Ki—mobility of charged ions, m$^2$/(V·s);
t—charging detention time, s.

8. The nano fluid electrostatic atomization controllable jet minimal quantity lubrication grinding system of claim 1, wherein the liquid supply system is connected with the nozzle body through a nano fluid conveying snakelike pipe, and the air supply system is connected with the nozzle body through a compressed gas conveying snakelike pipe.

9. A nano fluid electrostatic atomization controllable jet minimal quantity lubrication grinding system, comprising a grinding system, wherein the grinding system is provided with a corona charging nozzle, a nozzle body of the corona charging nozzle is connected with a liquid supply system and an air supply system, a high-voltage direct-current electrostatic generator at the lower part of the nozzle body is connected with a cathode of an adjustable high-voltage direct-current power supply, an anode of the adjustable high-voltage direct-current power supply is connected with a workpiece charging device, and the workpiece charging device is attached to a non-machined surface of a workpiece, wherein the nano fluid, which is used as a grinding liquid, is fed into the corona charging nozzle through the liquid supply system, meanwhile, the air supply system feeds compressed air into the corona charging nozzle, the nano fluid grinding liquid is charged into a controllable jet stream by the high-voltage direct-current electrostatic generator while being driven by the compressed air to be sprayed out and atomized from the nozzle body, and the controllable jet stream is controllably distributed to grinding area of the machined workpiece under the actions of an electric field force and an aerodynamic force, wherein the workpiece charging device comprises a workpiece charging device insulating shell, a weight, a permanent magnet and a pressure spring; the permanent magnet is arranged on the circumference of the workpiece charging device insulating shell; an opening is formed in the middle of the workpiece charging device insulating shell, and the weight extends out of the workpiece charging device insulating shell from one end and is matched with the pressure spring; a split pin slot for inserting a split pin is formed in the weight, and the weight is connected with the anode of the adjustable high-voltage direct-current power supply.

10. A nano fluid electrostatic atomization controllable jet minimal quantity lubrication grinding system, comprising a grinding system, wherein the grinding system is provided with a corona charging nozzle, a nozzle body of the corona charging nozzle is connected with a liquid supply system and an air supply system, a high-voltage direct-current electrostatic generator at the lower part of the nozzle body is connected with a cathode of an adjustable high-voltage direct-current power supply, an anode of the adjustable high-voltage direct-current power supply is connected with a workpiece charging device, and the workpiece charging device is attached to a non-machined surface of a workpiece, wherein the nano fluid, which is used as a grinding liquid, is fed into the corona charging nozzle through the liquid supply system, meanwhile, the air supply system feeds compressed air into the corona charging nozzle, the nano fluid grinding liquid is charged into a controllable jet stream by the high-voltage direct-current electrostatic generator while being driven by the compressed air to be sprayed out and atomized from the nozzle body, and the controllable jet stream is controllably distributed to grinding area of the machined workpiece under the actions of an electric field force and an aerodynamic force, wherein the adjustable high-voltage direct-current power supply comprises a transformer, the primary winding of the transformer is connected with an alternating-current power supply, two wires of the secondary winding of the transformer are respectively used as a direct-current voltage stabilizing unit V1 and a direct-current voltage stabilizing unit V2, the direct-current voltage stabilizing unit V1 is connected with a self-excited oscillating circuit, the self-excited oscillating circuit is connected with a power amplifying circuit, a high-frequency pulse booster, a voltage doubling rectifying circuit and a constant-current automatic control circuit, the constant-current automatic control circuit is connected with the direct-current voltage stabilizing unit V2, and the direct-current voltage stabilizing unit V2 is connected with a power amplifying unit; the adjustable voltage range of the adjustable high-voltage direct-current power supply is 2-120 kV; the direct-current voltage stabilizing unit V1 provides a working voltage for the self-excited oscillating circuit, the direct-current voltage stabilizing unit V2 provides main energy for power conversion, pulse signals are acquired by the self-excited oscillating circuit, amplified by the power amplifying circuit and boosted by the high-frequency pulse booster, and high-voltage signals are finally output and processed through the voltage doubling rectifying circuit, so that a direct-current high voltage is output; the constant-current automatic control circuit is used for automatically sampling the electrostatic working current of the voltage doubling rectifying circuit, and during constant current, when a working load is normally enlarged, the working current does not rise; and when an external load exceeds the permissible current, the self-excited oscillating circuit stops oscillating, and the high voltage is cut off.

* * * * *